United States Patent
McDonough (10) Patent No.: US 10,711,159 B2
(45) Date of Patent: Jul. 14, 2020

(54) POLISHING COMPOSITIONS

(71) Applicant: Fujifilm Planar Solutions, LLC, Mesa, AZ (US)

(72) Inventor: James McDonough, Gilbert, AZ (US)

(73) Assignee: FUJIFILM ELECTRONIC MATERIALS U.S.A., INC., North Kingstown, RI (US)

( * ) Notice: Subject to any disclaimer, the term of this patent is extended or adjusted under 35 U.S.C. 154(b) by 0 days.

(21) Appl. No.: 15/855,323

(22) Filed: Dec. 27, 2017

(65) Prior Publication Data

US 2018/0187047 A1 Jul. 5, 2018

Related U.S. Application Data (60) Provisional application No. 62/440,649, filed on Dec. 30, 2016.

(51) Int. Cl.
| | | |
|---|---|---|
| C09G 1/02 | (2006.01) | |
| C23F 3/04 | (2006.01) | |
| B24B 37/04 | (2012.01) | |
| H01L 21/321 | (2006.01) | |
| H01L 21/768 | (2006.01) | |

(52) U.S. Cl.
CPC .............. *C09G 1/02* (2013.01); *B24B 37/044* (2013.01); *C23F 3/04* (2013.01); *H01L 21/3212* (2013.01); *H01L 21/7684* (2013.01)

(58) Field of Classification Search
CPC ......... C09G 1/02; C09G 1/04; H01L 21/3212; H01L 21/7684; H01L 2224/03616; C09K 13/06

USPC ................... 252/79.4; 438/692, 693
See application file for complete search history.

(56) References Cited

U.S. PATENT DOCUMENTS

| | | |
|---|---|---|
| 8,337,715 B2 | 12/2012 | Minamihaba et al. |
| 9,752,057 B2 | 9/2017 | Hou et al. |
| 2003/0228762 A1* | 12/2003 | Moeggenborg .......... C09G 1/02 438/691 |

(Continued)

FOREIGN PATENT DOCUMENTS

| | | |
|---|---|---|
| CN | 1854225 A | 11/2006 |
| TW | 201629182 A | 8/2016 |

OTHER PUBLICATIONS

Merriam Webster Definition of "substantially" via https://www.merriam-webster.com/dictionary/substantially ; pp. 1-5; no date available.*

(Continued)

*Primary Examiner* — Binh X Tran
(74) *Attorney, Agent, or Firm* — Ohlandt, Greeley, Ruggiero & Perle, LLP (57) ABSTRACT

The present disclosure provides chemical mechanical polishing compositions that achieve minimal dishing at reduced dishing reducer (DR) levels when compared to known CMP compositions. The compositions of the disclosure include a dynamic surface tension reducer (DSTR) which allows for lower levels of dishing reducer in the compositions. Indeed, the compositions of the disclosure allow for lower levels of dishing reducer to achieve the same dishing as known compositions having higher levels of dishing reducer. Deleterious effects of high DR levels are thereby avoided or minimized when employing the compositions of the disclosure.

15 Claims, 8 Drawing Sheets

(56) References Cited

U.S. PATENT DOCUMENTS

| | | | |
|---|---|---|---|
| 2006/0243702 A1* | 11/2006 | Minamihaba | C09G 1/02 |
| | | | 216/88 |
| 2008/0026583 A1 | 1/2008 | Hardy et al. | |
| 2011/0180511 A1* | 7/2011 | Akatsuka | C09G 1/02 |
| | | | 216/83 |
| 2013/0168348 A1 | 7/2013 | Li et al. | |
| 2015/0221521 A1* | 8/2015 | Hou | H01L 21/3212 |
| | | | 438/693 |
| 2016/0027657 A1* | 1/2016 | Shi | C09G 1/02 |
| | | | 438/693 |

OTHER PUBLICATIONS

Merriam Webster Definition of "free" via https://www.merriam-webster.com/dictionary/free ; pp. 1-9; no date available.*

International Search Report dated Mar. 12, 2018 for PCT application No. PCT/US2017/068507.

Written Opinion dated Mar. 12, 2018 for PCT application No. PCT/US2017/068507.

Taiwan Search Report with Office Action dated Sep. 11, 2018 for Taiwan application No. 106146517.

International Preliminary Report on Patentability (IPRP) dated Jul. 2, 2019 for PCT application No. PCT/US2017/068507.

Chinese Office Action dated Nov. 15, 2019 for Chinese application No. 201711498020.6.

* cited by examiner

Typical process concept of copper CMP (Prior Art)

Hydrophobic drop, no DST Reducer    Hydrophobic drop, contains DST Reducer

POLISHING COMPOSITIONS

CROSS-REFERENCE TO RELATED APPLICATION

The present application claims the benefit of U.S. Provisional Application Ser. No. 62/440,649, filed on Dec. 30, 2016, which is herein incorporated by reference.

BACKGROUND OF THE DISCLOSURE

1. Field of the Disclosure

The present disclosure relates generally to polishing compositions, and methods for polishing semiconductor substrates using the compositions described herein. More particularly, the disclosure relates to chemical mechanical polishing compositions and methods for removing copper layers from a semiconductor substrate, where the compositions include synergistic combinations of surfactants.

2. Description of the Related Art

The process known as chemical-mechanical polishing (CMP) involves polishing different metal or non-metal layers on semiconductor wafers, using a polish pad and slurry. Copper is a commonly used material for forming interconnects in semiconductor manufacturing. Once a copper inlaid structure is formed by, for example, a damascene process, the isolated copper wires are made by polishing and clearing copper and barrier metal between the inlaid wires. Copper and barrier layer CMP involves polishing of copper and barrier layers. It is desired to polish the wafers at a high removal rate of material to enhance throughput, while still maintaining favorable wafer characteristics such as a low number of overall defects.

Figure 1A:
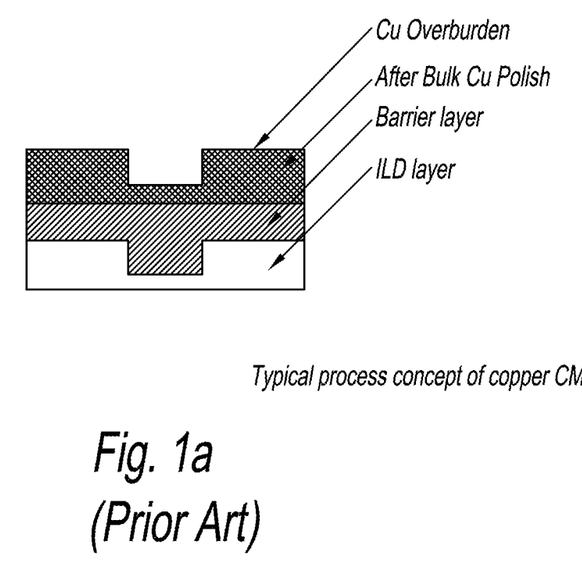
FIGS. 1a and 1b depict a copper CMP process according to the prior art.
Figure 1B:
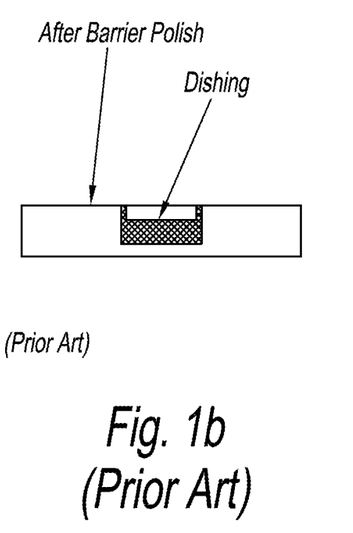

A typical copper CMP process consists of 3 process steps. First, the electro-plated copper overburden (up to 2 μm in thickness depending on technology node) is rapidly polished down at a relatively high down force, leaving some amount of copper until the deposition topography is fully planarized (see FIG. 1a). Throughput and planarization efficiency and low defects are key needs. The remaining copper overburden after full planarization during the first step is polished off at a lower down force, with a stop on the barrier layer (FIG. 1b).

In the above second polishing process, a phenomenon called dishing occurs, where the level of the top surface of the conductive film lowers. This is thought to be attributed to removal of the conductive films to an excessive degree, due to an excessively high ability of each of the first conventional polishing composition to polish the copper containing metal. The dishing reduces the cross-sectional area of the wiring, thereby causing an increase in wiring resistance. The dishing also impairs the flatness of the surface of a semiconductor device, thereby making it difficult to form multi-filmed wiring in the semiconductor device.

A goal in the CMP process is to clear all copper from the barrier metal, but achieve significantly low dishing on the inlaid copper wire, with very low defects and improved surface roughness. To this end, compounds functioning as dishing reducers (DR's) have been added to CMP compositions. Although this approach has met with some success, copper residue remaining on the wafer can be problematic when the concentration of dishing reducer is too high.

SUMMARY OF THE DISCLOSURE

The present disclosure provides chemical mechanical polishing (CMP) compositions that achieve minimal dishing, even at reduced dishing reducer (DR) levels when compared to other CMP compositions. The compositions of the disclosure also include a dynamic surface tension reducer (DSTR) which allows for lower levels of DR in the compositions. Indeed, the compositions of the disclosure allow for lower amounts of DR to achieve the same reduction in dishing as other compositions having higher levels of DR. Deleterious effects of high DR levels are thereby avoided or minimized when employing the compositions of the present disclosure.

In some embodiments, there are provided compositions including:
 a) an abrasive;
 b) a first surfactant comprising a phosphate;
 c) a second surfactant comprising an acetylenic compound;
 d) a complexing agent;
 e) at least one azole;
 f) optionally a pH adjustor; and
 f) water.

In some embodiments, there are provided compositions including:
 a) about 0.01 wt % to about 10 wt % of an abrasive;
 b) about 0.001 wt % to about 0.1 wt % of a first surfactant comprising a phosphate;
 c) about 0.001 wt % to about 0.1 wt % of a second surfactant comprising an acetylenic compound;
 d) about 0.1 wt % to about 20 wt % of a complexing agent;
 e) about 0.01 wt % to about 5 wt % of at least one azole; and
 f) water.

In some embodiments, there are provided compositions including:
 a) about 0.01 wt % to about 1.0 wt % of an abrasive;
 b) about 0.001 wt % to about 0.01 wt % of a first surfactant comprising a phosphate;
 c) about 0.001 wt % to about 0.01 wt % of a second surfactant comprising an acetylenic compound;
 d) about 0.1 wt % to about 2.0 wt % of a complexing agent;
 e) about 0.01 wt % to about 0.5 wt % of at least one azole;
 f) about 0.1 wt % to about 5 wt % oxidizer; and
 g) water.

In some embodiments, there are provided methods of removing a copper layer from a substrate. Such methods can be performed, for example, by contacting the copper layer with a composition of the disclosure, wherein the composition removes the copper layer at a rate that is at least 75 percent of a peak removal rate of the composition.

In some embodiments, there are provided methods of polishing a substrate. Such methods can be performed, for example, by:
 (a) providing a substrate with at least one metal layer;
 (b) contacting the substrate with a composition of the disclosure, and
 (c) chemically mechanically polishing the substrate with the composition.

The compositions set forth in this disclosure contain abrasives that are generally insoluble in water. Therefore, the compositions of the disclosure may be referred to as slurries. For the purposes of this disclosure, the terms "composition" and "slurry" and "compositions" and "slurries" are used interchangeably.

The following list defines some of the terms used in the present disclosure:

complexing agent: a compound forming a soluble or insoluble complex with a metal ion;

oxidizers: chemicals that oxidize the metal atoms to a higher valence state;

corrosion inhibitor: chemicals that protect a metal surface from corroding;

abrasive: solid particles that aid in mechanical removal of wafer surface;

normalized removal rate: the ratio of a particular removal rate to that of a reference, such as the peak removal rate, or the removal rate of a baseline composition;

peak removal rates: the highest removal rate for a given slurry;

oxidizer level for peak removal rate: the oxidizer concentration that corresponds to the peak removal rate The term "synergy" or "synergistic" as used in the present disclosure signifies the effect when two components combine to achieve greater results in an objective than would be expected based on their individual properties alone.

DETAILED DESCRIPTION OF THE DISCLOSURE

The present disclosure provides chemical mechanical polishing compositions that achieve minimal dishing, even at reduced dishing reducer (DR) levels when compared to known CMP compositions. The compositions of the disclosure include a dynamic surface tension reducer (DSTR), which allows for lower levels of DR in the compositions. Indeed, the compositions of the disclosure allow for lower levels of DR to achieve the same reduction in dishing as known compositions having higher levels of DR. Deleterious effects of high DR levels are thereby avoided or minimized when employing the compositions of the disclosure.

In this sense, the DR and DSTR of the present disclosure are synergistic, in that the lower levels of dishing achieved by the combination of the DR and DSTR are better than would be expected based on the expected amount of dishing reduction one would expect from the DR or DSTR alone. The discovery by the present disclosure of the improved effects of the combination of the DR and DSTR allows for the use of less DR, which as stated above leads to less copper residue remaining on the substrate surface after polishing.

As described in greater detail below, the compositions of the present disclosure include a) an abrasive; b) a first surfactant comprising a phosphate; c) a second surfactant comprising an acetylenic compound; d) a complexing agent; e) at least one azole; and f) water.

Abrasives contemplated for use in the compositions of the disclosure include, but are not limited to, alumina, fumed silica, colloidal silica, coated particles, titania, ceria, zirconia, or any combinations thereof. In some embodiments, the abrasive is colloidal silica. The abrasive can be present in an amount of 0.05 wt % to 5 wt %, based on the total weight of the composition, or any subranges therebetween.

The complexing agent can be any compound that performs the desired function of forming a soluble or insoluble complex with a metal ion. In one embodiment, the complexing agent is selected from the group consisting of organic acids and their salts, amino acetic acids, amino acids such as glycine or alanine, carboxylic acids, polyamines, ammonia based compounds, quaternary ammonium compounds, inorganic acids, compounds with both carboxylic and amino functions, such as ethylenediaminetetraacetic acid and diethylene triamine pentaacetic acid, or any mixtures thereof. In another embodiment, the complexing agent is glycine. The complexing agent can be present in an amount of about 0.1 wt percent to about 20 wt percent, or 0.1 to about 10 wt percent, or 0.1 to about 5 wt percent, or 0.1 to about 2 wt percent, each based on the total weight of the composition, or any subranges therebetween of the listed ranges.

Corrosion inhibitors contemplated for use in the compositions of the disclosure include, but are not limited to, azoles, triazoles, benzotriazole and its derivatives, tolyl triazole and its derivatives, certain surfactants, or any mixtures thereof. The corrosion inhibitor can be present in an amount of about 100 ppm to about 10,000 ppm, or about 100 ppm to about 2000 ppm, each based on the weight of the composition, or any subranges therebweteen of the listed ranges.

In the compositions and methods of the disclosure, the first surfactant can function as the dishing reducer (DR). In some embodiments, the first surfactant is a phosphate. In other embodiments, the first surfactant is a polyoxyethylene alkyl ether phosphate, polyoxyethylene aryl alkyl ether phosphate, polyoxyethylene nonylaryl ether phosphate, polyoxyethylene nonylphenyl ether phosphate, or any combinations or mixtures thereof. Other compounds that may be used for the DR are sulfates, phosphonates, sulfonates, amines, and compounds with carboxylic acid groups.

In the compositions and methods of the disclosure, the second surfactant can function as the dynamic surface tension reducer (DSTR). In some embodiments, the second surfactant is an acetylenic compound. In some embodiments, the second surfactant is an acetylene glycol or an ethoxylated adduct thereof. In some embodiments, the second surfactant is an ethoxylated adduct of 2,4,7,9-tetramethyl-5-decyne-4,7-diol.

The amounts of DR and DSTR should be adjusted in accordance with several considerations. When the DSTR is present in too small an amount, it does not provide any of the surface tension reducing benefits described herein. When the amount of DSTR is too high, it can create too much foaming in the composition, which makes the composition too difficult to use, dilute, and filter. A lot of air bubbles function as a blockade in the filter, and reduce the places that liquid can pass through in the tortuous filter fiber network. Pressure can build up, as it is more difficult for the liquid to pass through the filter. Since the DR protects the copper material on the substrate to prevent dishing, when too much DR is used, it can lead to copper residue remaining on the substrate after polishing. When too little DR is used, however, not enough protection is provided to the copper and more dishing occurs. The DR can be present in an amount of up to 0.5 wt % of the composition, or any subranges thereof. The DSTR can be present in an amount of up to 1 wt % of the composition, or any subranges thereof.

Thus, in one specific composition according to the present disclosure, the composition comprises:
  a) about 0.1 wt % to about 10 wt % of an abrasive;
  b) about 0.01 wt % to about 0.1 wt % of a first surfactant comprising a phosphate;
  c) about 0.01 wt % to about 0.1 wt % of a second surfactant comprising an acetylenic compound;
  d) about 1 wt % to about 20 wt % of a complexing agent;
  e) about 0.1 wt % to about 5 wt % of at least one azole; and
  f) water.

It is to be understood that the concentration ranges for each component set forth above reflect concentrations of each component that are present in a CMP concentrate. Prior to use, compositions as set forth above are typically diluted at least about 5×. In some embodiments, the compositions are diluted at least about 10×. In other embodiments, the compositions are diluted at least about 20×.

When the compositions of this embodiment are diluted, oxidizer is typically added to the composition. Oxidizers contemplated for use in the compositions of the disclosure include, but are not limited to, hydrogen peroxide, ammonium persulfate, silver nitrate ($AgNO_3$), ferric nitrates or chlorides, per acids or salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMgO_4$, other inorganic or organic peroxides, or mixtures or combinations thereof. In some embodiments, the oxidizer is hydrogen peroxide. The oxidizer can be present in an amount so that the diluted, point-of-use (POU) slurry has about 0.1 wt % to about 5 wt % of oxidizer, or from about 0.4 wt % to about 2 wt %.

Thus, in one embodiment, the present disclosure provides a POU composition comprising:
  a) about 0.01 wt % to about 1.0 wt % of an abrasive;
  b) about 0.001 wt % to about 0.01 wt % of a first surfactant comprising a phosphate;
  c) about 0.001 wt % to about 0.01 wt % of a second surfactant comprising an acetylenic compound;
  d) about 0.1 wt % to about 2.0 wt % of a complexing agent;
  e) about 0.01 wt % to about 0.5 wt % of at least one azole;
  f) about 0.1 wt % to about 5 wt % oxidizer; and
  g) water.

In some embodiments, there are provided methods of removing a copper layer from a substrate. Such methods can be performed, for example, by contacting the copper layer with a composition of the disclosure wherein the composition removes the copper layer at a rate that is at least 75 percent of a peak removal rate of the composition.

In some embodiments, there are provided methods of polishing a substrate. Such methods can be performed, for example, by:
  (a) providing a substrate with at least one metal layer;
  (b) contacting the substrate with a composition of the disclosure, and
  (c) chemically mechanically polishing the substrate with the composition.

In addition, in some embodiments, the compositions of the present disclosure may contain additives such as pH adjusting agents, corrosion inhibitors, additional surfactants, organic solvents, and defoaming agents as optional components.

In some embodiments, the compositions of the disclosure can have a base acting as a pH adjustor. The base pH adjustor helps in taking the composition pH to its operating pH value. The base used to adjust the pH can be any suitable base, such as potassium hydroxide, ammonium hydroxide, sodium hydroxide, cesium hydroxide, triethanol amine, tetrabutyl ammonium hydroxide, tetramethyl ammonium hydroxide, or any combinations thereof. The pH adjustor can be present in an amount so that the pH of the concentrate or the POU composition is from 4 to 9, or any subranges thereof.

In some embodiments, the etching compositions of the present disclosure may specifically exclude one or more of the following components, in any combination. Such components are selected from the group consisting of silane compounds, grafted polymeric materials, water-soluble polymers, Cu, Ta, Ti, or Rb ions, sulfonic acid, fatty acid, 2-pyrrolidone, N-methylpyrrolidone, 1,3-dimethyl-2-imidazolidinone, gramine, adenine, N,N'-diisopropylethylenediamine, N,N'-bis(2-hydroxyethyl)ethylenediamine, N,N'-dibenzylethylenediamine, N,N'-diphenylethylenediamine, ammonia, poly(meth)acrylate, acetic acid, urea hydrogen peroxide, tartaric acid, poly(vinylpyrrolidone), long chain alkylamines, alcoholamines, quinolinecarboxylic acid, quinolinic acid, a divalent organic acid, a hydroxyl acid, peroxosulfuric acid or a salt thereof, aromatic sulfonic acid, aromatic carboxylic acid, unsintered cerium oxide, and multivalent organic acid containing no nitrogen atoms.

Figure 2A:
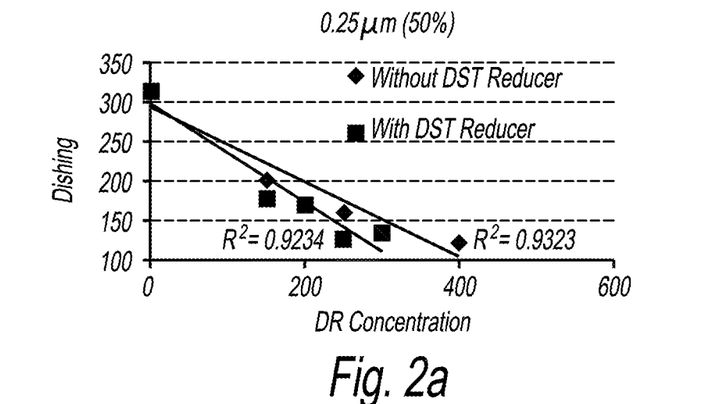
FIGS. 2a, 2b, and 2c present dishing data demonstrating that compositions of the disclosure allow for lower DR concentrations to achieve the same reduction in dishing as compositions with higher DR concentrations.
Figure 2B:
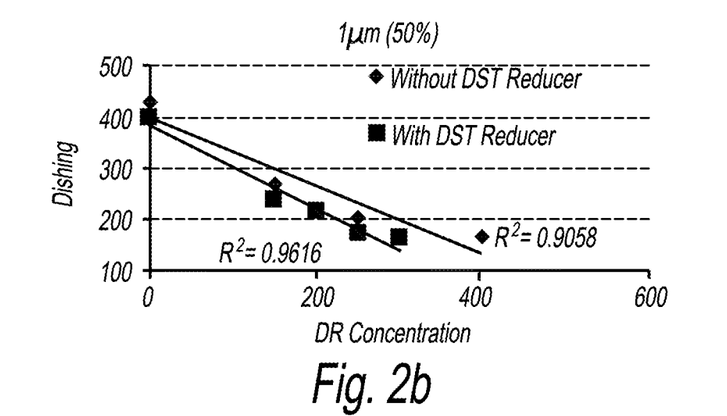
Figure 2C:
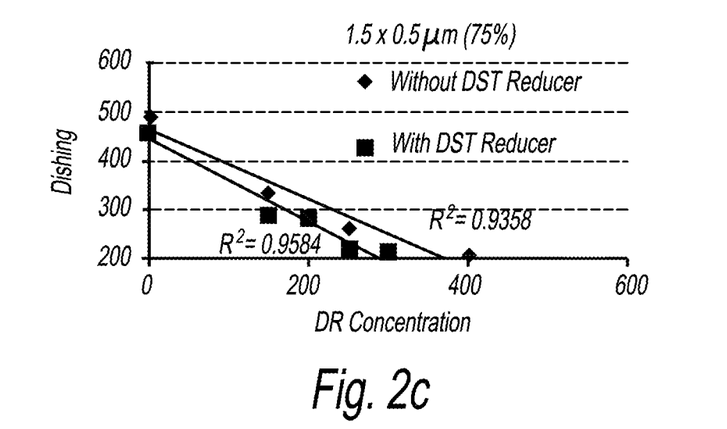

FIGS. 2a-2c shows data relating to dishing defects on substrates polished with the compositions of the present disclosure. The graphs compare the amount of dishing defects found on the substrate after polishing with a composition having no DSTR, and one with a DR and DSTR. As can be seen, in the composition without the DSTR, a much higher concentration of DR is needed to achieve favorable dishing results. For example, with 0.25 micrometer dishing defect sizes (FIG. 2a), to achieve a total count of 100 defects, approximately 400 ppm of DR is needed without the DSTR. When the DSTR is used, only approximately 300 ppm of DR is needed to achieve the same result. Similar results are seen with the graph depicting other defect sizes.

Figure 2D:
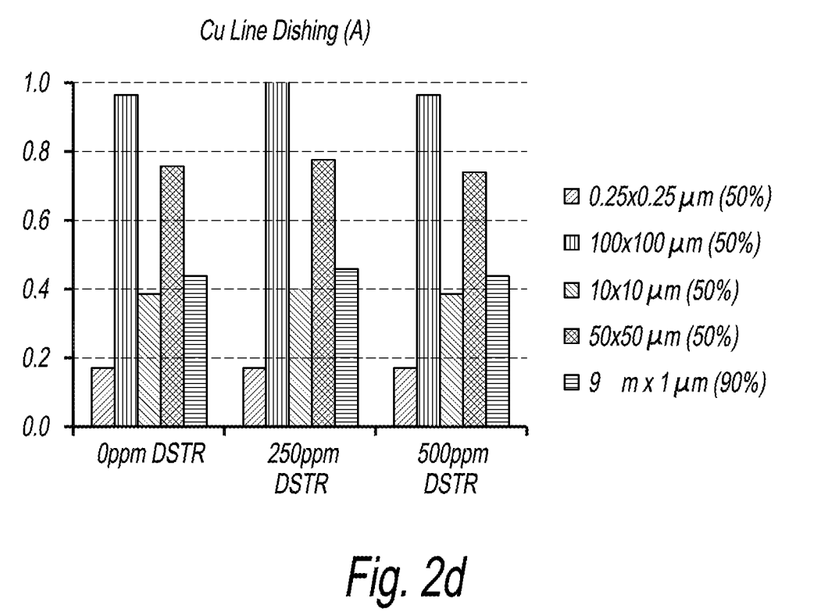
FIG. 2d shows a plot of the effect of DSTR concentration on dishing rates, for several sizes of defects.

The amount of DSTR in each of the compositions of FIGS. 2a-2c is 500 ppm, based on the total weight of the concentrate. FIG. 2d shows that the DSTR has no effect on dishing in itself. The data in FIG. 2d is normalized to the highest amount of dishing defects shown, which is for a 100-micron square defect at 250 ppm of DSTR. As can be seen in FIG. 2d, there is virtually no increase or decrease in the amount of dishing defects, across varying defect sizes and amounts of DSTR. Thus, the effect discussed above and shown in FIGS. 2a-2c is synergistic and surprising. The skilled artisan would not have expected the DSTR to have an improved effect on dishing, when used in conjunction with a DR, since the DSTR provides no beneficial effect on its own. Were a composition having only DSTR and no DR included in the plots of FIGS. 2a and 2c, the best fit line would be approximately horizontal.

Figure 3A:
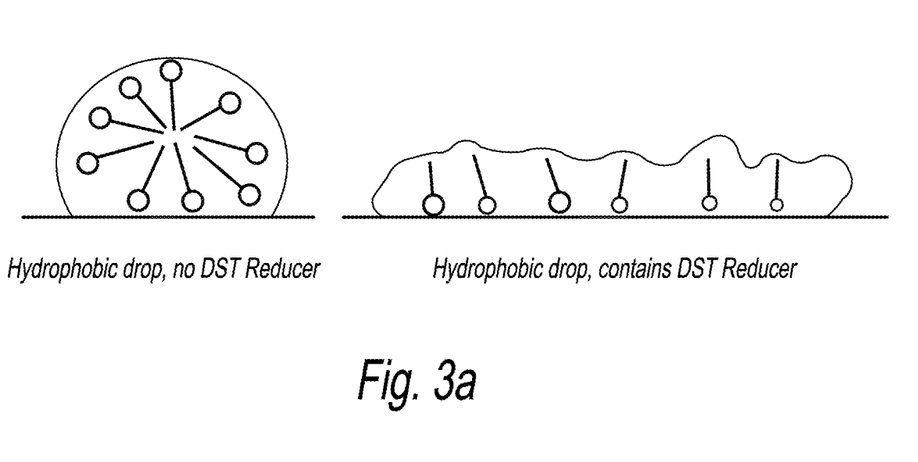
FIGS. 3a and 3b are a schematic and rendering, respectively, of a mechanism by which DR levels can be reduced while maintaining efficacy.
Figure 3B:
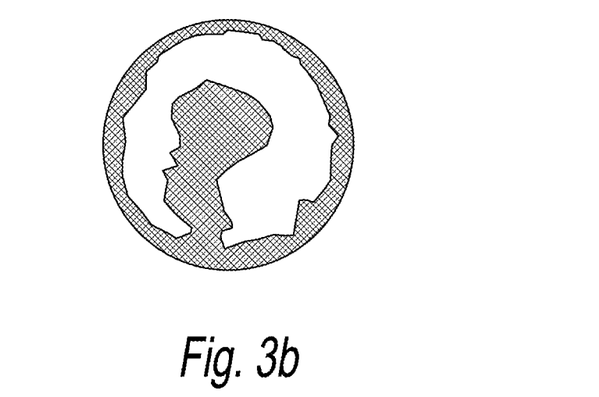

FIGS. 3a and 3b show a schematic diagram of what may be taking place when the compositions of the present disclosure are used. Without being bound by theory, as seen on the image on left in FIG. 3a, when no DSTR is used the inventors of the present disclosure surmise that surface tension keeps the shape of the drops of the composition. This prevents the DR from spreading out and contacting the entire surface of the substrate. Even when large amounts of DR are used, the shown tension limits their usefulness. When the DSR is employed, the water drop of the composition bursts, enabling the DR to spread out across the substrate. The image at the bottom of FIG. 3 shows the adverse effect that too much DR can have on the substrate, namely copper residue on the surface.

Figure 4A:
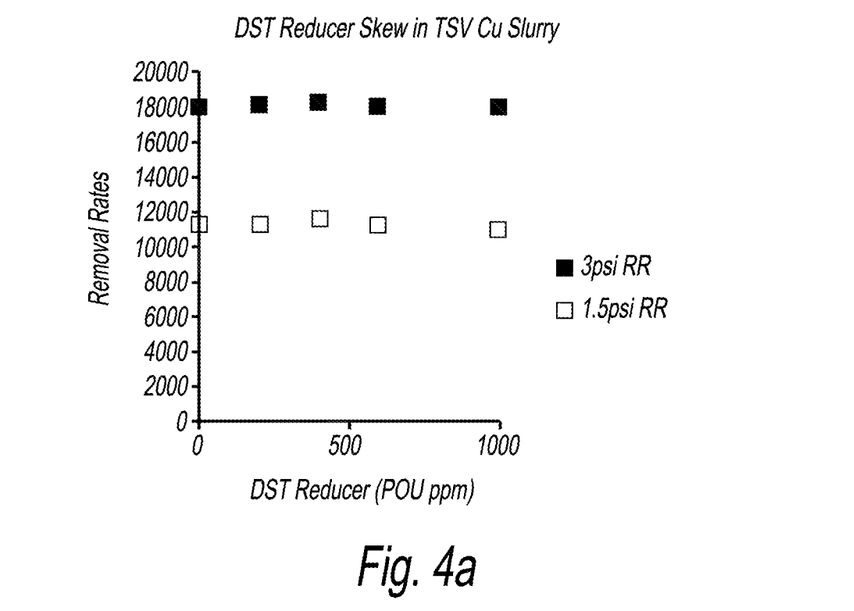
FIGS. 4a and 4b present TSV removal rate (RR) data showing that even at extreme DSTR loadings, removal rates (RR's) do not drop.
Figure 4B:
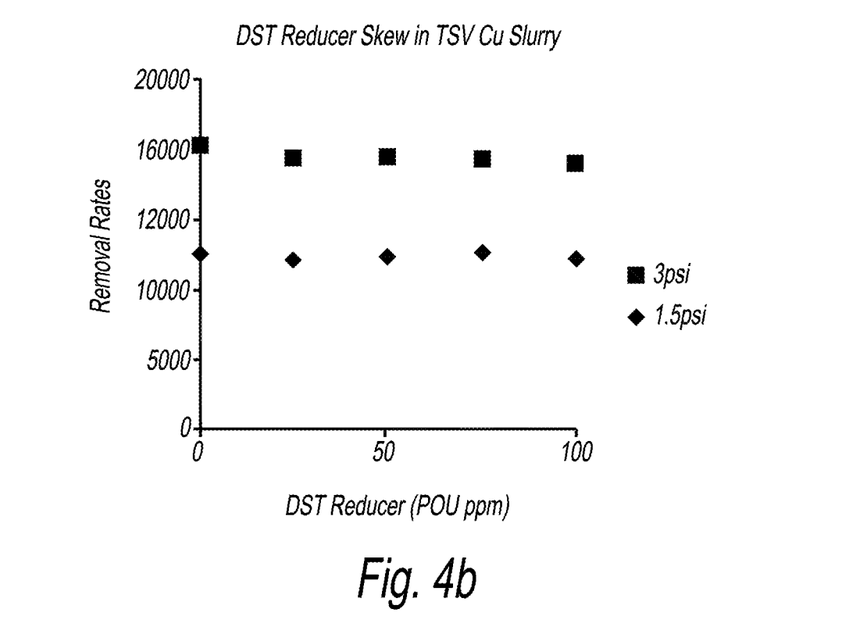
Figure 5A:
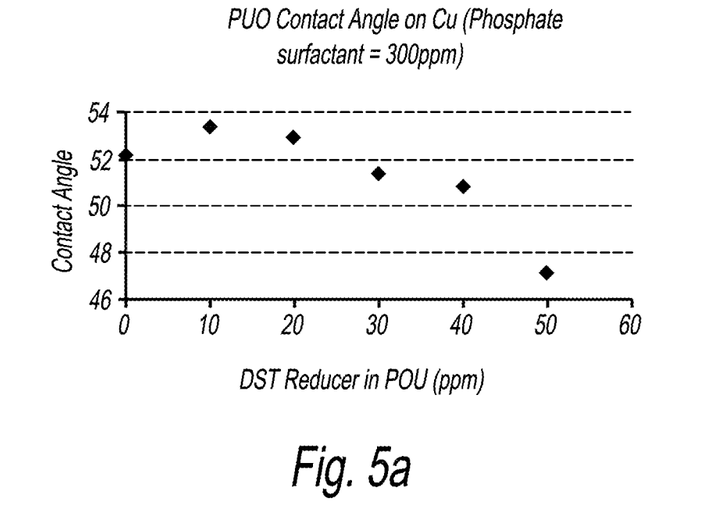
FIGS. 5a, 5b, and 5c present contact angle data showing DSTR reduction of contact angle on a copper wafer.
Figure 5B:
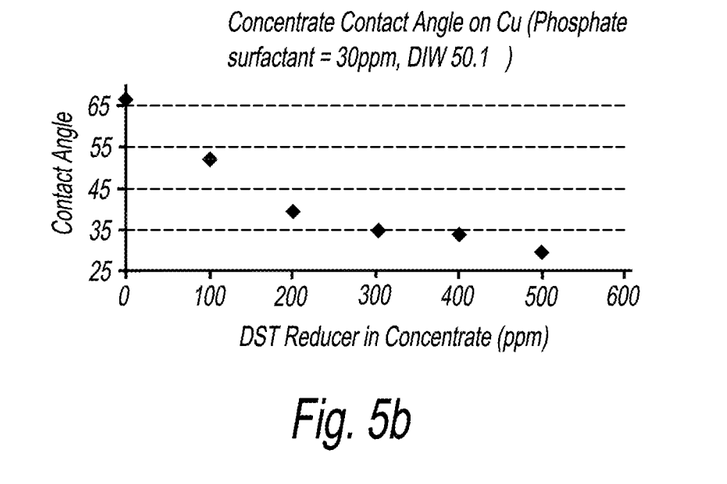
Figure 5C:
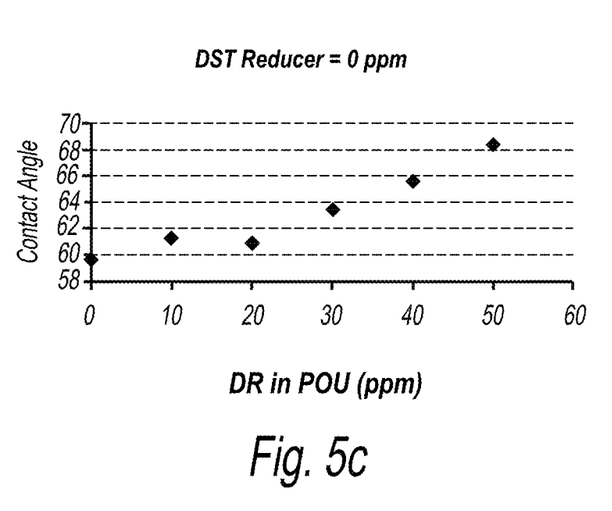
Figure 6:
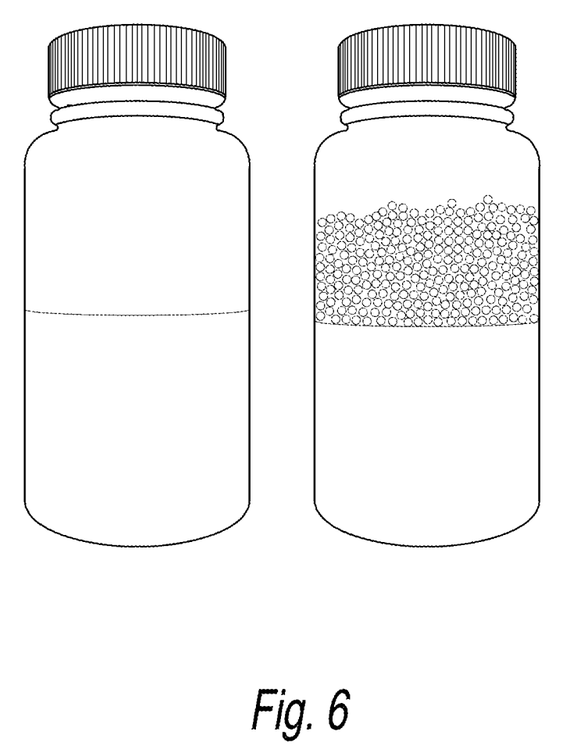
FIG. 6 illustrates a defoaming property of the DSTR employed by compositions of the disclosure. As is readily apparent, foaming of an exemplary formulation is reduced by half, compared to a formulation which does not contain the DSTR. This is relevant for filterability of concentrates.

FIGS. 4a and 4b show that the amount of the DSTR has minimal, if any, effect on the removal rate of the composition. FIGS. 5a-5c show data relating to the contact angle of the composition as a function of the concentration of the DR and DST. The DR itself creates a hydrophobic surface on copper, as reflected in a contact angle increase as DR is increased (FIG. 5c). This is not desirable, because it makes it difficult for the aqueous slurry to coat the surface uniformly (similar to a RainX type of coating on a windshield, i.e. aqueous droplets bead up and are repelled by a hydrophobic surface). Contact angle shows the wetting capability improvement of the composition that the addition of DSTR provides, and the DSTR also makes the copper surface more hydrophilic (i.e. the contact angle decreases). As the contact angle decreases, the composition is wetting the copper surface. Increased wetting leads to more uniform polishing across the whole wafer surface, better process tuning responses and also is the key to allowing the use less of the DR as FIG. 3 shows. For instance, with poor wetting and a center fast removal rate profile, it can be hard to correct if the fluid dynamics are such that some spots on the wafer surface become hydrophobic and are just repelling slurry. With better wetting and ensuring slurry is wetting the entire wafer quickly and uniformly, the removal rate profiles appear to be more tunable. Also, extra wetting helps slurry infiltration into recessed copper areas, especially for small features, ensuring that the DR can properly attach to even the smallest of the copper lines and protect it to reduce dishing. FIG. 6 shows a side-by-side comparison of two compositions, one without DSTR. The DSTR greatly reduces the foaming exhibited by the composition, which makes the composition much easier to work with when preparing diluted concentrates.

The following examples are intended to further illustrate the subject matter of this disclosure and should in no way be construed as limiting the disclosure.

EXAMPLES

The following formulation is a typical composition contemplated for use in the practice of the disclosure. All values are in wt %. The amounts shown are for a concentrate, which at POU is diluted by a factor of 10.

|  | Formula 1 |
| --- | --- |
| Complexing agent | 0.1-20 |
| Silica | 0.01-10 |
| Azole 1 | 0.001-5 |
| DR | 0.001-0.1 |
| DSTR | 0.001-0.1 |
| Azole 2 | 0.001-5 |
| pH | 4-9 |
| Dilution Ratio | 10 |

While this disclosure has been described with respect the examples set forth herein, it is understood that other modifications and variations are possible without departing from the spirit and scope of the disclosure as defined in the appended claims.

What is claimed is:

1. A composition comprising:
   a) about 0.01 wt % to about 10 wt % of an abrasive;
   b) about 0.001 wt% to about 0.1 wt % of a first surfactant comprising a phosphate;
   c) about 0.001 wt% to about 0.05 wt % of a second surfactant comprising an acetylenic compound;
   d) about 0.1 wt % to about 20 wt% a complexing agent;
   e) about 0.001 wt % to about 5 wt% of at least one azole; and
   f) water,
   wherein the composition is free of poly(vinylpyrrolidone).

2. The composition of claim 1 wherein the abrasive is selected from the group consisting of alumina, fumed silica, colloidal silica, coated particles, titania, ceria, zirconia, and any combinations thereof.

3. The composition of claim 1 wherein the phosphate is selected from polyoxyethylene alkyl ether phosphates.

4. The composition of claim 1 wherein the phosphate is selected from polyoxyethylene aryl alkyl ether phosphates.

5. The composition of claim 1 wherein the phosphate is selected from polyoxyethylene nonylaryl ether phosphates.

6. The composition of claim 1 wherein the phosphate is selected from polyoxyethylene nonylphenyl ether phosphates.

7. The composition of claim 1 wherein the acetylenic compound is an acetylene glycol or an ethoxylated adduct thereof.

8. The composition of claim 1 wherein the acetylenic compound is an ethoxylated adduct of 2,4,7,9-tetramethyl-5-decyne-4,7-diol.

9. The composition of claim 1 further comprising an oxidizer.

10. The composition of claim 1 wherein the complexing agent is selected from the group consisting of organic acids and their salts, amino acetic acids, amino acids, carboxylic acids, polyamines, ammonia based compounds, quaternary ammonium compounds, inorganic acids, compounds with both carboxylic and amino functions, ethylenediaminetetraacetic acid, diethylene triamine pentaacetic acid, and any mixtures thereof.

11. The composition of claim 10 wherein the complexing agent is selected from amino acids.

12. The composition of claim 11 wherein the complexing agent is glycine.

13. A composition comprising:
   a) about 0.01 wt % to about 1.0 wt % of an abrasive;
   b) about 0.001 wt% to about 0.01 wt % of a first surfactant comprising a phosphate;
   c) about 0.001 wt% to about 0.01 wt % of a second surfactant comprising an acetylenic compound;
   d) about 0.1 wt % to about 2.0 wt% of a complexing agent;
   e) about 0.001 wt % to 0.5 wt% of at least one azole;
   f) about 0.1 wt % to about 5 wt % oxidizer; and
   g) water.

14. A method of removing a copper layer from a substrate, comprising contacting the copper layer with the composition of claim 13, wherein the composition removes the copper layer at a rate that is at least 75 percent of a peak removal rate of the composition.

15. A method of polishing a substrate, comprising the steps of:
(a) providing a substrate with at least one metal layer;
(b) contacting the substrate with a composition of claim 13, and
(c) chemically mechanically polishing the substrate with the composition.

* * * * *